(12) United States Patent
Yamamoto et al.

(10) Patent No.: US 8,305,160 B2
(45) Date of Patent: Nov. 6, 2012

(54) ELASTIC WAVE DEVICE AND DUPLEXER

(75) Inventors: Ayaka Yamamoto, Nagaokakyo (JP); Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/327,961

(22) Filed: Dec. 16, 2011

(65) Prior Publication Data

US 2012/0086520 A1   Apr. 12, 2012

Related U.S. Application Data

(63) Continuation of application No. PCT/JP2010/058200, filed on May 14, 2010.

(30) Foreign Application Priority Data

Jun. 26, 2009   (JP) ................................. 2009-152022

(51) Int. Cl.
*H03H 9/72* (2006.01)
*H03H 9/64* (2006.01)
(52) U.S. Cl. .......................... 333/133; 333/193; 333/195
(58) Field of Classification Search .................. 333/133, 333/193–196; 310/313 B, 313 D
See application file for complete search history.

(56) References Cited

U.S. PATENT DOCUMENTS

| 7,135,944 B2 * | 11/2006 | Iwamoto et al. ............... 333/133 |
| 7,518,470 B2 * | 4/2009 | Makibuchi et al. ............ 333/193 |
| 2003/0030512 A1 * | 2/2003 | Takamine ...................... 333/193 |
| 2007/0075804 A1 | 4/2007 | Otsuka |
| 2009/0289740 A1 | 11/2009 | Takamine |

FOREIGN PATENT DOCUMENTS

| JP | 10-261935 A | 9/1998 |
| JP | 2000-224003 A | 8/2000 |
| JP | 2007-104052 A | 4/2007 |
| JP | 2008-118277 A | 5/2008 |
| WO | 2008/108113 A1 | 9/2008 |

OTHER PUBLICATIONS

Official Communication issued in International Patent Application No. PCT/JP2010/058200, mailed on Aug. 17, 2010.

* cited by examiner

*Primary Examiner* — Barbara Summons
(74) *Attorney, Agent, or Firm* — Keating & Bennett, LLP (57) ABSTRACT

An elastic wave device includes an unbalanced terminal and first and second balanced terminals. A longitudinally-coupled-resonator-type first elastic wave filter is provided between the unbalanced terminal and the first balanced terminal. An elastic wave filter, which is connected in parallel with the first elastic wave filter, is connected between the unbalanced terminal and the second balanced terminal. The current paths through which IDT electrodes of the elastic wave filters of the elastic wave device are connected to ground terminals, are not symmetrical.

13 Claims, 9 Drawing Sheets

ELASTIC WAVE DEVICE AND DUPLEXER

BACKGROUND OF THE INVENTION

1. Field of the Invention

The present invention relates to elastic wave devices that utilize elastic waves, such as surface acoustic waves or boundary acoustic waves. More specifically, the present invention relates to elastic wave devices including a plurality of longitudinally-coupled-resonator-type elastic wave filters that are connected with each other.

2. Description of the Related Art

An RF-stage duplexer of a mobile telephone device includes a transmission-side filter and a reception-side filter. A duplexer in which a transmission-side filter and a reception-side filter are defined by elastic wave filters is disclosed in, for example, Japanese Unexamined Patent Application Publication No. 2008-118277.

Figure 12:
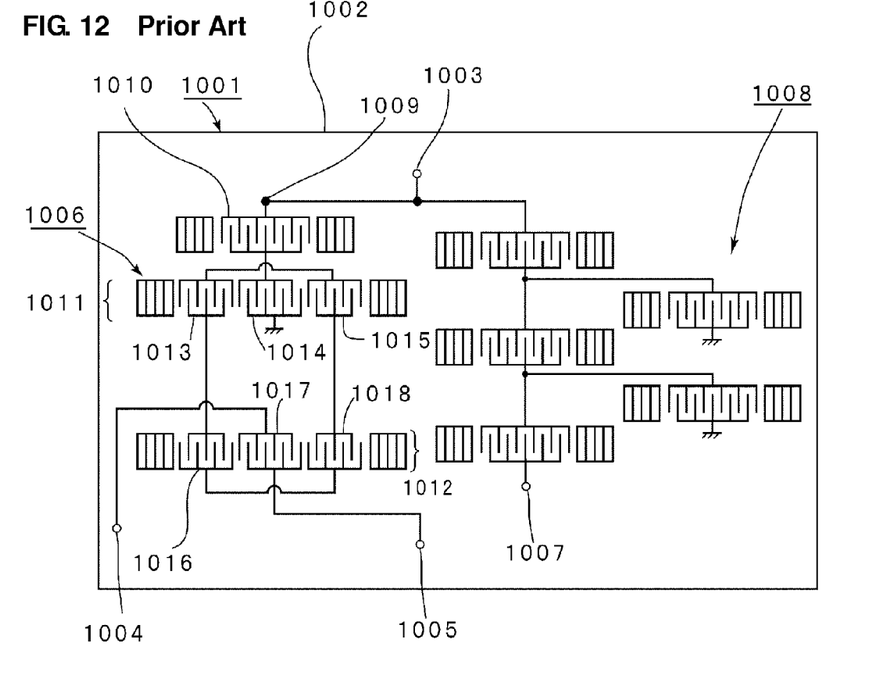
FIG. 12 is a schematic plan view illustrating the electrode structure of a known elastic wave device.

FIG. 12 is a plan view schematically illustrating the electrode structure of the duplexer described in Japanese Unexamined Patent Application Publication No. 2008-118277. A duplexer 1001 includes the illustrated electrode structure provided on a piezoelectric substrate 1002.

Specifically, a reception-side filter 1006 is connected between an antenna terminal 1003 and first and second balanced terminals 1004 and 1005, which function as first and second reception terminals. Furthermore, a transmission-side filter 1008 is connected between the antenna terminal 1003 and a transmission terminal 1007. The transmission-side filter 1008 is configured as a ladder circuit including a plurality of elastic wave resonators.

In contrast, the reception-side filter 1006 includes an unbalanced terminal 1009, which is connected to the antenna terminal 1003, and the first and second balanced terminals 1004 and 1005. Here, a first elastic wave filter 1011 is connected to the unbalanced terminal 1009 via a single-port elastic wave resonator 1010. The first elastic wave filter 1011 includes first to third IDT electrodes 1013 to 1015 and is a three-IDT longitudinally-coupled-resonator-type surface acoustic wave filter. Similarly, a second elastic wave filter 1012 is also a three-IDT longitudinally-coupled-resonator-type surface elastic wave filter including first to third IDT electrodes 1016 to 1018.

One end of the second IDT electrode 1014 is connected to the unbalanced terminal 1009 via the elastic wave resonator 1010 and the other end thereof is connected to a ground terminal. One end of the first IDT electrode 1013 and one end of the third IDT electrode 1015 are connected to each other and the other ends thereof are respectively connected to one end of the first IDT electrode 1016 and one end of the third IDT electrode 1018 of the second elastic wave filter 1012. The other ends of the first and third IDT electrodes 1016 and 1018 are connected to each other. One end of the second IDT electrode 1017 is connected to the first balanced terminal 1004 and the other end thereof is connected to the second balanced terminal 1005. Thus, a balanced-unbalanced conversion function is provided.

This type of filter having a balanced-unbalanced conversion function is a float-balance-type elastic wave filter.

Figure 13:
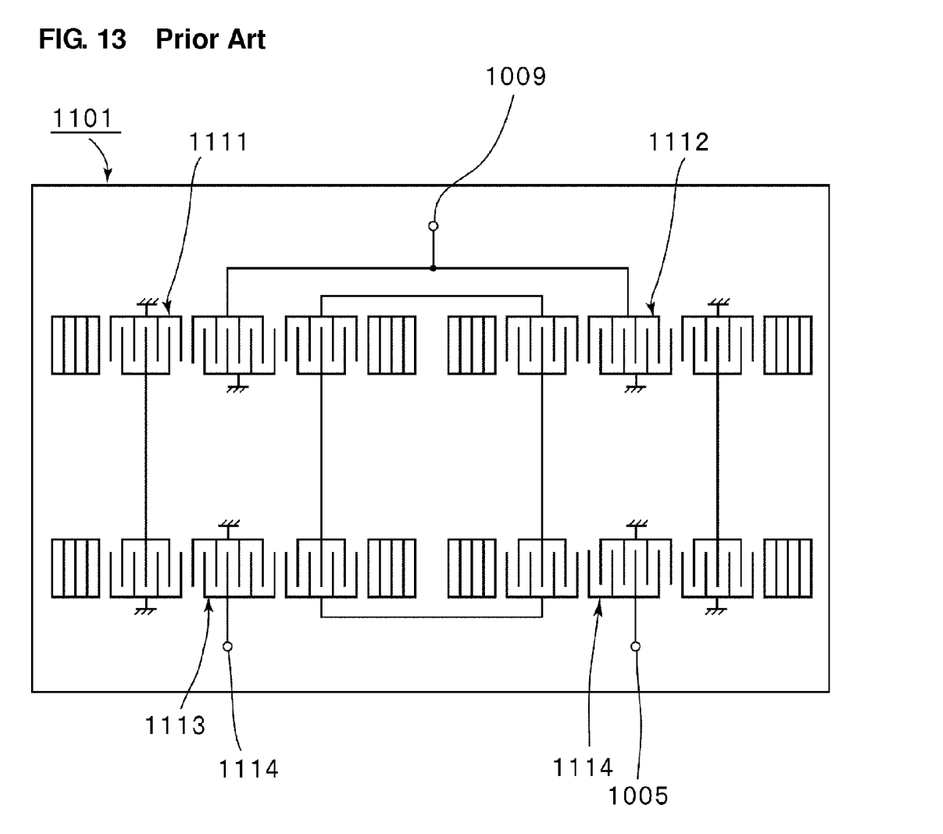
FIG. 13 is a schematic plan view for explaining another example of a known elastic wave device.

On the other hand, as illustrated in FIG. 13, a neutral-point-balance-type elastic wave filter, which is not a float-balance-type elastic wave filter, is also known. In the elastic wave filter 1101 illustrated in FIG. 12, the first and second elastic wave filters 1111 and 1112 are connected in parallel with the unbalanced terminal 1009. The third and fourth elastic wave filters 1113 and 1114 are cascade connected to the first and second elastic wave filters 1111 and 1112, respectively, and the third and fourth elastic wave filters 1113 and 1114 are respectively connected to the first and second balanced terminals 1004 and 1005.

A float-balance-type elastic wave filter, such as the reception-side filter 1006 illustrated in FIG. 12, is capable of reducing loss to a greater extent than a neutral-point balance-type filter. However, in a float-balance-type elastic wave filter, there is a problem in that the degree of balance between signals at the first and second balanced terminals 1004 and 1005 is worse than that in a neutral-point-balance-type filter. This is due to the fact that the first balanced terminal 1004 and the second balanced terminal 1005 are affected differently by floating capacitances and other factors, because in a float-balance-type filter, wiring connected to the first and second balanced terminals 1004 and 1005 cannot be made symmetrical, in contrast to in a neutral-point-balance filter. Consequently, in the duplexer 1001 illustrated in FIG. 12, there is a problem in that the reception-side filter 1006 is not sufficiently isolated from the pass band of the transmission-side filter 1008.

SUMMARY OF THE INVENTION

To overcome the problems described above, preferred embodiments of the present invention provide an elastic wave device that is not only capable of reducing loss within the pass band, but is also capable of making the spurious level outside the pass band small and consequently is capable of improving isolation characteristics when being used together with a filter having a different pass band and to provide a duplexer that includes the elastic wave device and that has outstanding isolation characteristics.

An elastic wave device according to a first preferred embodiment of the present invention preferably includes a piezoelectric substrate, an unbalanced terminal provided on the piezoelectric substrate, first and second balanced terminals provided on the piezoelectric substrate, a plurality of ground terminals provided on the piezoelectric substrate, a longitudinally-coupled-resonator-type first elastic wave filter provided on the piezoelectric substrate, and a longitudinally-coupled-resonator-type second elastic wave filter provided on the piezoelectric substrate. The first elastic wave filter preferably includes first to third IDT electrodes arranged in order in an elastic wave propagation direction and two reflectors arranged on both sides in the elastic wave propagation direction of a region in which the first to third IDT electrodes are provided, one end of the second IDT electrode being connected to the first balanced terminal and the other end thereof being connected to the second balanced terminal. In the first elastic wave filter, one end of the first IDT electrode and one end of the third IDT electrode are preferably connected to the unbalanced terminal and the other end of the first IDT electrode and the other end of the third IDT electrode are preferably connected to any one of the plurality of ground terminals. The second elastic wave filter preferably includes first to third IDT electrodes arranged in order in an elastic wave propagation direction and two reflectors arranged on both sides in the elastic wave propagation direction of a region in which the first to third IDT electrodes are provided. In the second elastic wave filter, one end of the second IDT electrode is preferably connected to the first balanced terminal and the other end thereof is connected to the second balanced terminal, one end of the first IDT electrode and one end of the third IDT electrode are connected to the unbalanced terminal, and the other end of the first IDT electrode and the other end of the third IDT electrode are connected to any one of the plurality of ground terminals. A current path connecting the first elastic wave filter and a ground terminal and a current path connecting the second elastic wave filter and a ground terminal are different.

Preferably, the number of ground terminals connected to the first elastic wave filter and the number of ground terminals connected to the second elastic wave filter are different. Consequently, the current path that connects an end of the first elastic wave filter that is to be connected to the ground potential and a ground terminal and the current path that connects an end of the second elastic wave filter that is to be connected to the ground potential and a ground terminal, are different.

Preferably, the other end of the first IDT electrode and the other end of the third IDT electrode are connected to different ground terminals, and in the second elastic wave filter, the other end of the first IDT electrode and the other end of the third IDT electrode are connected to the same ground terminal.

An elastic wave device according to a second preferred embodiment of the present invention preferably includes a piezoelectric substrate, an unbalanced terminal provided on the piezoelectric substrate, first and second balanced terminals provided on the piezoelectric substrate, a plurality of ground terminals provided on the piezoelectric substrate, longitudinally-coupled-resonator-type first to fourth elastic wave filters provided on the piezoelectric substrate, first and second connection wirings that cascade connect the first elastic wave filter and the second elastic wave filter, and third and fourth connection wirings that cascade connect the third and fourth elastic wave filters. Each of the first to fourth elastic wave filters preferably includes first to third IDT electrodes arranged in order in an elastic wave propagation direction and reflectors arranged on both sides in the elastic wave propagation direction of a region in which the first to third IDT electrodes are provided. In the first elastic wave filter, one end of the second IDT electrode is connected to the unbalanced terminal and the other end thereof is connected to any one of the plurality of ground terminals, one end of the first IDT electrode is connected to the first connection wiring and the other end thereof is connected to any one of the plurality of ground terminals, and one end of the third IDT electrode is connected to the second connection wiring and the other end thereof is connected to any one of the plurality of ground terminals. In the second elastic wave filter, one end of the second IDT electrode is connected to the first balanced terminal and the other end thereof is connected to the second balanced terminal, one end of the first IDT electrode is connected to the first connection wiring and the other end thereof is connected to any one of the plurality of ground terminals, and one end of the third IDT electrode is connected to the second connection wiring and the other end thereof is connected to any one of the plurality of ground terminals. In the third elastic wave filter, one end of the second IDT electrode is connected to the unbalanced terminal and the other end thereof is connected to any one of the plurality of ground terminals, one end of the first IDT electrode is connected to the third connection wiring and the other end thereof is connected to any one of the plurality of ground terminals, and one end of the third IDT electrode is connected to the fourth connection wiring and the other end thereof is connected to any one of the plurality of ground terminals. In the fourth elastic wave filter, one end of the second IDT electrode is connected to the first balanced terminal and the other end thereof is connected to the second balanced terminal, one end of the first IDT electrode is connected to the third connection wiring and the other end thereof is connected to any one of the plurality of ground terminals, and one end of the third IDT electrode is connected to the fourth connection wiring and the other end thereof is connected to any one of the plurality of ground terminals. A current path that connects the first and second elastic wave filters and a ground terminal and a current path that connects the third and fourth elastic wave filters and a ground terminal are preferably different.

Preferably, the total number of ground terminals connected to the first and second elastic wave filters and the total number of ground terminals connected to the third and fourth elastic wave filters are different. Consequently, the current path that connects ends of the first and second elastic wave filters that are to be connected to the ground potential and a ground terminal and the current path that connects ends of the third and fourth elastic wave filters that are to be connected to the ground potential and a ground terminal, are different.

Preferably, in the first elastic wave filter, the other end of the first IDT electrode and the other end of the third IDT electrode are connected to different ground terminals, and in the third elastic wave filter, the other end of the first IDT electrode and the other end of the third IDT electrode are connected to the same ground terminal.

Preferably, in the second elastic wave filter, the other end of the first IDT electrode and the other end of the third IDT electrode are connected to different ground terminals, and in the fourth elastic wave filter, the other end of the first IDT electrode and the other end of the third IDT electrode are connected to the same ground terminal.

In the first and second preferred embodiments, surface acoustic waves or boundary acoustic waves may be used as the elastic waves. Therefore, the elastic wave filter may be a surface acoustic wave filter or a boundary acoustic wave filter.

A duplexer according to a preferred embodiment of the present invention preferably includes a reception-side filter and a transmission-side filter, the reception-side filter being defined by an elastic wave device according to a preferred embodiment of the present invention. Therefore, as compared to using a neutral-point-balance filter, not only can loss be reduced in the elastic wave filter, but also isolation of the pass band of transmission-side filter from that of the reception-side filter can be improved.

Preferably, an antenna-side terminal and an elastic wave resonator are further provided, the elastic wave resonator being connected in series between the antenna-side terminal and the unbalanced terminal of the elastic wave device.

In the elastic wave device according to the first preferred embodiment, the second elastic wave filter is a float-balance-type elastic wave filter and, therefore, not only is loss reduced, but also spurious responses outside the pass band are prevented or minimized since the current path that connects an end of the first elastic wave filter to be connected to the ground potential and a ground terminal and the current path that connects an end of the second elastic wave filter that is to be connected to the ground potential and a ground terminal, are different. Consequently, the isolation characteristics are improved when the elastic wave device is used together with a filter having a different pass band.

Similarly, in the elastic wave device according to the second preferred embodiment, the second and fourth elastic wave filters are float-balance-type filters and, therefore, not only is insertion loss reduced, but also spurious responses outside the pass band are prevented or minimized since the current path that connects ends of the first and second elastic wave filters to be connected to the ground potential and a ground terminal and the current path that connects ends of the third and fourth elastic wave filters that are to be connected to the ground potential and a ground terminal, are different.

Consequently, the isolation characteristics are improved when the elastic wave device is used together with a filter having a different pass band.

Therefore, when an elastic wave device according to a preferred embodiment of the present invention is used as the reception-side filter of a duplexer, isolation of the pass band of the transmission-side filter from that of the reception-side filter is effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

Figure 1:
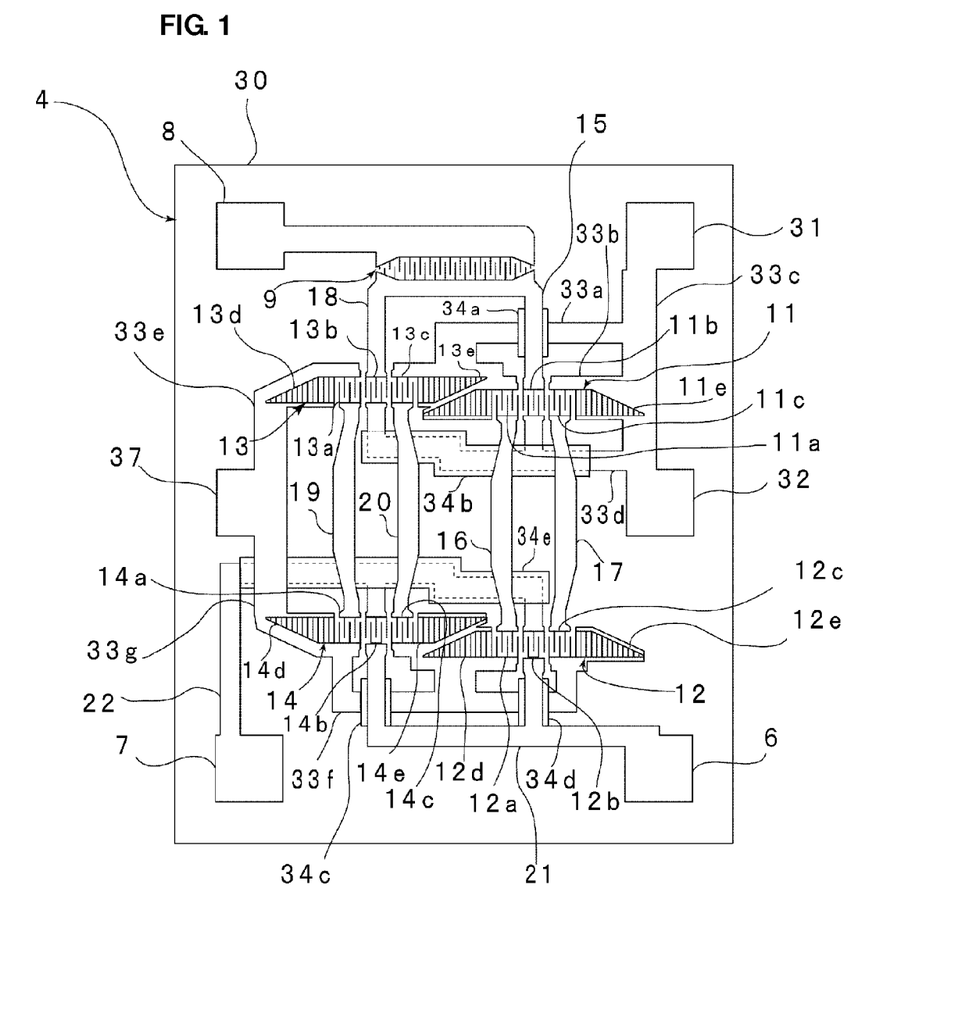
FIG. 1 is a schematic plan view of an elastic wave device according to a first preferred embodiment of the present invention.
Figure 2:
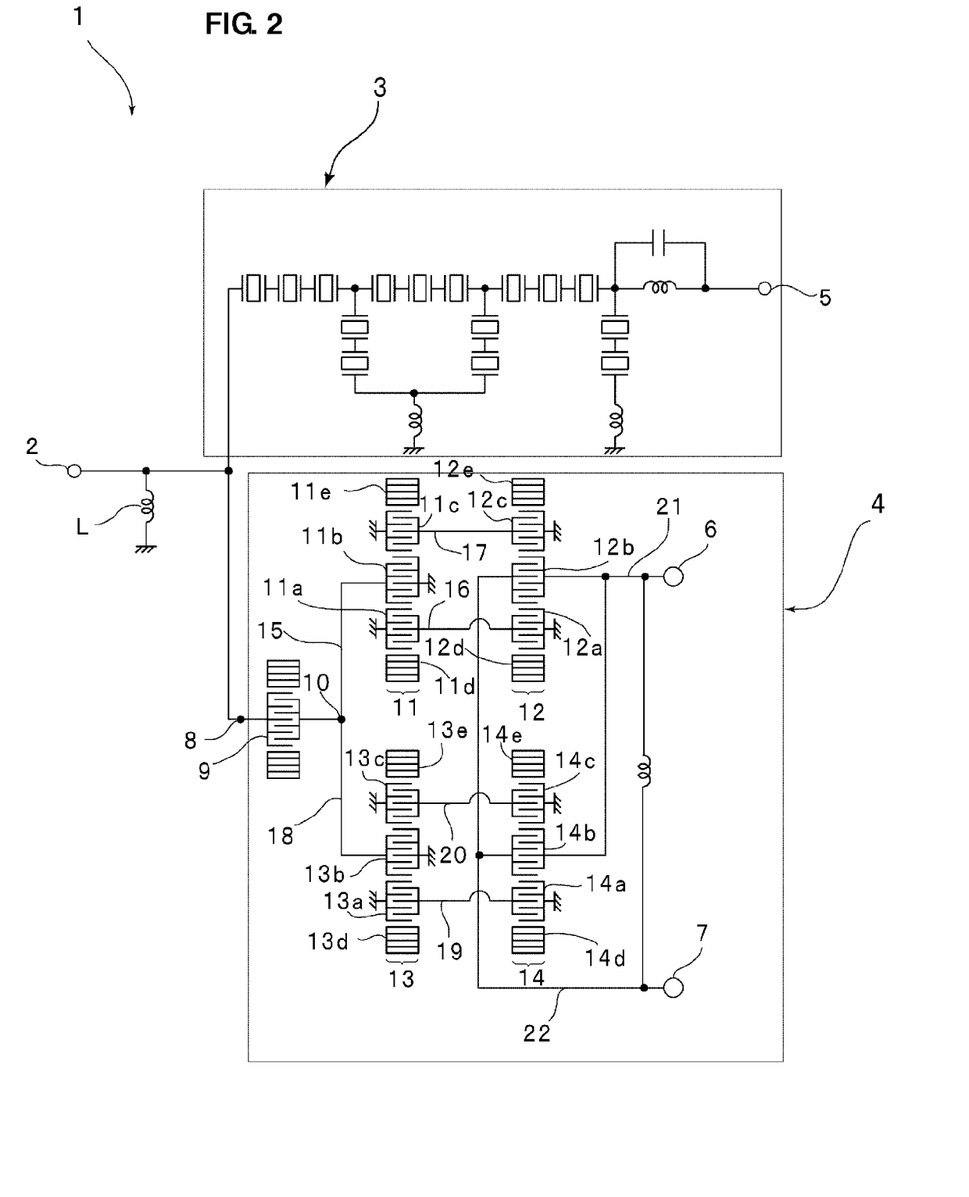
FIG. 2 is a schematic circuit diagram of a duplexer according to a preferred embodiment of the present invention, the duplexer including the elastic wave device of the first preferred embodiment of the present invention, which defines a reception-side filter.

FIG. 1 is a schematic plan view illustrating the electrode structure of an elastic wave device according to a first preferred embodiment of the present invention. FIG. 2 is a schematic circuit diagram illustrating a duplexer including the elastic wave filter illustrated in FIG. 1, which defines a reception-side filter 4.

A duplexer 1 illustrated in FIG. 2, is an RF-stage duplexer of a mobile telephone device used in the band: UMTS Band 2. The transmission frequency band of UMTS Band 2 is from about 1850 MHz to about 1910 MHz and the reception frequency band thereof is from about 1930 MHz to about 1990 MHz, for example.

In the duplexer 1, a transmission-side filter 3 and a reception-side filter 4 are connected to an antenna terminal 2. The transmission-side filter 3 is preferably a band pass filter having a ladder type circuit configuration in which a plurality of surface acoustic wave resonators are connected to one another. Of course, in the duplexer according to preferred embodiments of the present invention, the configuration of the transmission-side filter is not particularly limited. One end of the transmission-side filter 3 is connected to the antenna terminal 2 and the other end thereof is connected to a transmission terminal 5.

The reception-side filter 4 is preferably a balance-type band pass filter having a balanced-unbalanced signal-conversion function and including an unbalanced terminal 8 and first and second balanced terminals 6 and 7. The unbalanced terminal 8 is connected to the antenna terminal 2. An inductance L, arranged to provide impedance adjustment, is connected between the antenna terminal 2 and the ground potential.

The reception-side filter 4 preferably includes the illustrated electrode structure provided on a piezoelectric substrate.

As illustrated in FIG. 2, preferably, longitudinally-coupled-resonator-type first and third elastic wave filters 11 and 13 are connected in parallel with the unbalanced terminal 8 via a single-port-type surface acoustic wave resonator 9. The first elastic wave filter 11 includes first to third IDT electrodes 11a to 11c arranged in order in the surface acoustic wave propagation direction. Reflectors 11d and 11e are provided on both sides of the region in which the first to third IDT electrodes 11a to 11c are provided in the surface acoustic wave propagation direction. The third elastic wave filter 13 similarly includes first to third IDT electrodes 13a to 13c and reflectors 13d and 13e.

One end of the second IDT electrode 11b of the first elastic wave filter 11 is connected to a common connection point 10 and the other end thereof is connected to the ground potential. The common connection point 10 is connected to the unbalanced terminal 8 via the single-port-type surface acoustic wave resonator 9. One end of each of the first and third IDT electrodes 11a and 11c is connected to the ground potential.

The first elastic wave filter 11 is preferably cascade connected with a second elastic wave filter 12. That is, the second elastic wave filter 12 is preferably a three-IDT-type longitudinally-coupled-resonator-type surface acoustic wave filter that includes first to third IDT electrodes 12a to 12c and reflectors 12d and 12e. The other end of the first IDT electrode 11a of the first elastic wave filter 11 is connected to one end of the first IDT electrode 12a of the second elastic wave filter 12 through first connection wiring 16. The other end of the first IDT electrode 12a is connected to the ground potential. Similarly, the other end of the third IDT electrode 11c of the first elastic wave filter is connected to one end of the third IDT electrode 12c of the second elastic wave filter 12 through second connection wiring 17, and the other end of the third IDT electrode 12c is connected to the ground potential. In this manner, the second elastic wave filter 12 is cascade connected to the first elastic wave filter 11.

One end of the second IDT electrode 12b is connected to the first balanced terminal 6 and the other end thereof is connected to the second balanced terminal 7. That is, the second elastic wave filter 12 is preferably a surface acoustic wave filter having a float-balance-type balanced-unbalanced conversion function.

Similarly, a fourth elastic wave filter 14 is also cascade connected to the third elastic wave filter 13. The fourth elastic wave filter 14 is a three-IDT-type longitudinally-coupled-resonator-type surface acoustic wave filter including first to third IDT electrodes 14a to 14c and reflectors 14d and 14e.

The third and fourth elastic wave filters 13 and 14 are preferably connected in a manner similar to the first and second elastic wave filters 11 and 12. That is, one end of the second IDT electrode 13b of the third elastic wave filter 13 is connected to the unbalanced terminal 8 through the common connection point 10 and the other end thereof is connected to the ground potential. One end of each of the first and third IDT electrodes 13a and 13c of the third elastic wave filter 13 is connected to the ground potential and the other ends thereof are respectively connected to one end of the first IDT electrode 14a and one end of the third IDT electrode 14c of the fourth elastic wave filter 14 via third and fourth wirings and 20. The other ends of the first and third IDT electrodes 14a and 14c are connected to the ground potential. One end of the second IDT electrode 14b of the fourth elastic wave filter 14 is connected to the first balanced terminal 6 and the other end thereof is connected to the second balanced terminal 7.

In addition, although not specifically illustrated, in the first to fourth elastic wave filters 11 to 14, in portions at which the IDTs are adjacent to one another, narrow-pitch electrode finger portions are preferably provided at the ends of the IDTs in which the electrode finger pitch is narrower than the electrode finger pitch in the remaining IDT portions.

The characteristics of the reception-side filter 4, as an example of the elastic wave device of this preferred embodiment, will be more specifically described with reference to FIG. 1.

As illustrated in FIG. 1, the reception-side filter 4 preferably includes the above-described electrode structure provided on a piezoelectric substrate 30. Here, the piezoelectric substrate 30 is preferably a 40°±5° rotated Y-cut X-propagating LiTaO$_3$ substrate, for example. Instead, the piezoelectric substrate 30 may be made of a LiTaO$_3$ substrate having another cut angle. The piezoelectric substrate 30 may also be made of another piezoelectric single crystal, such as LiNbO$_3$ or quartz or may be made of a piezoelectric ceramic, for example.

The reception-side filter 4 is preferably formed on the piezoelectric substrate 30 by forming an electrode structure made of Al, for example.

The reference numerals in FIG. 1 correspond to the reference numerals of the reception-side filter 4 illustrated in FIG. 2. That is, the first and second balanced terminals 6 and 7 and the unbalanced terminal 8 are preferably formed using rectangular-shaped electrode films made of Al, for example. Furthermore, first to third ground terminals 31, 32 and 37, which are connected to the ground potential, are preferably formed using electrode films made of Al, for example.

An end of the first IDT electrode 11a of the first elastic wave filter 11 connected to the ground potential and an end of the third IDT electrode 13c of the third elastic wave filter 13 connected to the ground potential, are connected to each other and are connected to wiring 33a. The wiring 33a passes under the wiring 15. Here, the wiring 15 and the wiring 33a are electrically insulated from each other by an insulating film 34a preferably made of a polyimide film, for example. That is, the wiring 15 passes along the upper surface of the insulating film 34a.

An end of the third IDT electrode 11c of the first elastic wave filter 11 that is connected to the ground potential, is electrically connected to wiring 33b. The wiring 33b is continuous with wiring 33c. Furthermore, an end of the second IDT electrode 11b of the first elastic wave filter 11 that is connected to the ground potential, is connected to wiring 33d. An end of the second IDT electrode 13b of the third elastic wave filter 13 that is connected to the ground potential is also connected to the wiring 33d. The wiring 33d is also connected to the above-mentioned wiring 33c. The wiring 33c is connected to a first ground terminal 31 and a second ground terminal 32.

Therefore, the ends of the first to third IDT electrodes 11a to 11c of the first elastic wave filter 11 that are connected to the ground potential are electrically connected to the first ground terminal 31 and the second ground terminal 32, that is, two ground terminals.

On the other hand, in the third elastic wave filter 13, an end of the first IDT electrode 13a that is connected to the ground potential is connected to wiring 33e, and the wiring 33e is connected to the third ground terminal 37. An end of the second IDT electrode 13b that is connected to the ground potential is connected to the wiring 33d. An end of the third IDT electrode 13c that is connected to the ground potential is connected to the wiring 33a.

Furthermore, in order to electrically insulate the first, second, and fourth connection wirings 16, 17 and 20, and the wiring 33d from each other, an insulating film 34b is provided. The insulating film 34b is arranged so as to cover the wiring 33d and the first, second, and fourth connection wirings 16, 17 and 20 pass along the top of the insulating film 34b.

In the second elastic wave filter 12, one end of the second IDT electrode 12b is connected to the first balanced terminal 6 though wiring 21. The wiring 21 is also connected to one end of the second IDT electrode 14b of the fourth elastic wave filter 14. Ends of the first and third IDT electrodes 12a and 12c of the second elastic wave filter 12 and ends of the first and third IDT electrodes 14a and 14c of the fourth elastic wave filter 14, on the sides thereof connected to the ground potential, are connected to one another through wiring 33f. In order to electrically insulate the wiring 33f and the wiring 21 from each other, insulating films 34c and 34d are preferably disposed therebetween at portions at which they cross each other. The wiring 33f is connected to the third ground terminal 37.

On the other hand, the other ends of the second IDT electrode 12b of the second elastic wave filter 12 and the second IDT electrode 14b of the fourth elastic wave filter 14 are connected to each other through wiring 22 and are connected to the second balanced terminal 7. In order to electrically insulate the wiring 22 and the first, third, and fourth connection wirings 16, 19 and 20 from each other and to electrically insulate the wiring 22 and wiring 33g to be described later from each other, an insulating film 34e is preferably provided. The insulating films 34b to 34e are arranged in the same or substantially the same manner as the above-described insulating film 34a.

The wiring 33f is connected to the third ground terminal 37 through the wiring 33g that passes along the top of the insulating film 34e.

In the third elastic wave filter 13, the ends of the IDT electrodes 13a to 13c that are connected to the ground potential, are connected to three ground terminals, namely, the first ground terminal 31, the second ground terminal 32, and the third ground terminal 37. Thus, in the first elastic wave filter 11 and the third elastic wave filter 13, the number of ground terminals to which ends of the first to third IDT electrodes 11a to 11c connected to the ground potential are connected and the number of ground terminals to which ends of the first to third IDT electrodes 13a to 13c on the sides connected to the ground potential are connected, are preferably different. Therefore, in this preferred embodiment, the structure of portions on the first and second elastic wave filter 11 and 12 side connected to the ground potential and the structure on the side of the third and fourth elastic wave filters 13 and 14 connected to the ground potential, are preferably different.

Therefore, in the first elastic wave filter 11 and the third elastic wave filter 13, as schematically illustrated in FIG. 1, the electrical connection structures through which the IDT electrode 11a and the IDT electrode 13a are connected to the ground potential are not symmetrical. Thus, as will be described below, isolation of the reception-side filter 4 is improved. This will be described based on a specific practical example.

In the following example, the reception-side filter 4 of the present preferred embodiment was provided.

First Elastic Wave Filter 11

A wavelength determined by the electrode finger pitch of portions of the IDT electrodes 11a to 11c other than that of the narrow pitch electrode finger portion is denoted by $\lambda I$.

Crossing width: about 19.4 $\lambda I$

Numbers of electrode fingers of IDT electrodes 11a and 11c: 33. There is a narrow pitch electrode finger portion including three electrode fingers at the end on the second IDT electrode 11b side. Therefore, the number of electrode fingers in the remaining electrode finger portion is 33−3=30.

Number of electrode fingers of second IDT electrode 11b: Number of electrode fingers including those of narrow electrode pitch portions is thirty-four. Narrow pitch electrode finger portions are provided, each including seven electrode fingers, at ends on sides adjacent to the first and third IDT electrodes 11a and 11c.

Number of electrode fingers in the reflectors 11d and 11e: 75

Metallization ratio: about 0.70

Electrode film thickness: about 0.087 $\lambda I$

Second Elastic Wave Filter 12

Crossing Width=about 16.5 $\lambda I$

Numbers of electrode fingers in IDT electrodes 12a and 12c: 33. There is a narrow pitch electrode finger portion including three electrode fingers at an end on the second IDT electrode 12b side. Therefore, the number of electrode fingers in the remaining electrode finger portion is 33−3=30.

Number of electrode fingers in second IDT electrode 12b: thirty-eight including those in narrow pitch electrode finger portions on both sides. The narrow pitch electrode finger portions on both sides are each composed of six electrode fingers.

Number of electrode fingers in reflectors: about 75

Metallization ratio: about 0.70

Electrode film thickness: about 0.087 $\lambda I$

Third and Fourth Elastic Wave Filters 13 and 14

The third and fourth elastic wave filters 13 and 14 are the same or substantially the same as the elastic wave filters 11 and 12 described above.

Single-Port-Type Surface Acoustic Wave Resonator 9

Crossing width=about 14.7 $\lambda I$

Number of IDT electrode fingers: 201.

Number of electrode fingers in reflectors: 18

Metallization ratio: about 0.60

Electrode film thickness: about 0.089 $\lambda I$

Figure 3:
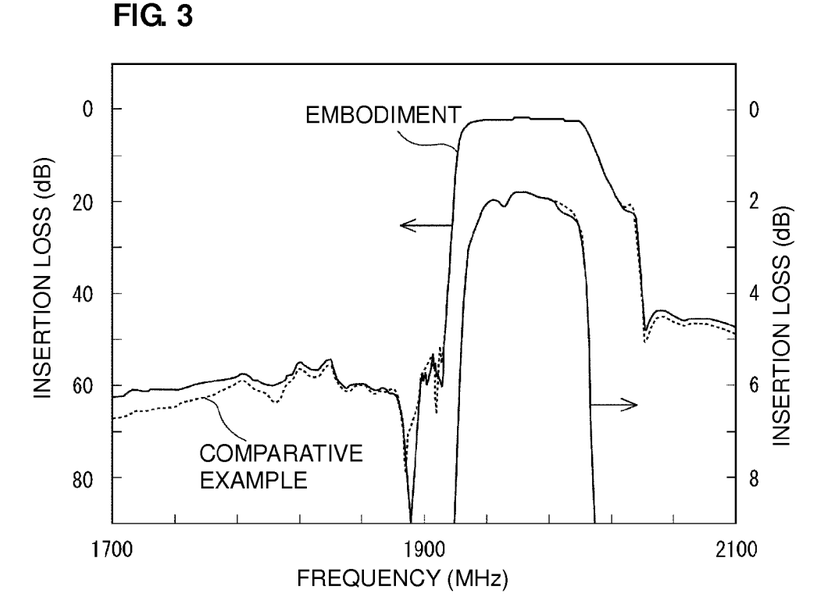
FIG. 3 is a graph illustrating attenuation frequency characteristics of the elastic wave device of the first preferred embodiment and of an elastic wave device of a comparative example.

The attenuation frequency characteristics of the reception-side filter 4 are illustrated by the solid line in FIG. 3. The dashed line in FIG. 3 illustrates the results for a comparative example.

Figure 7:
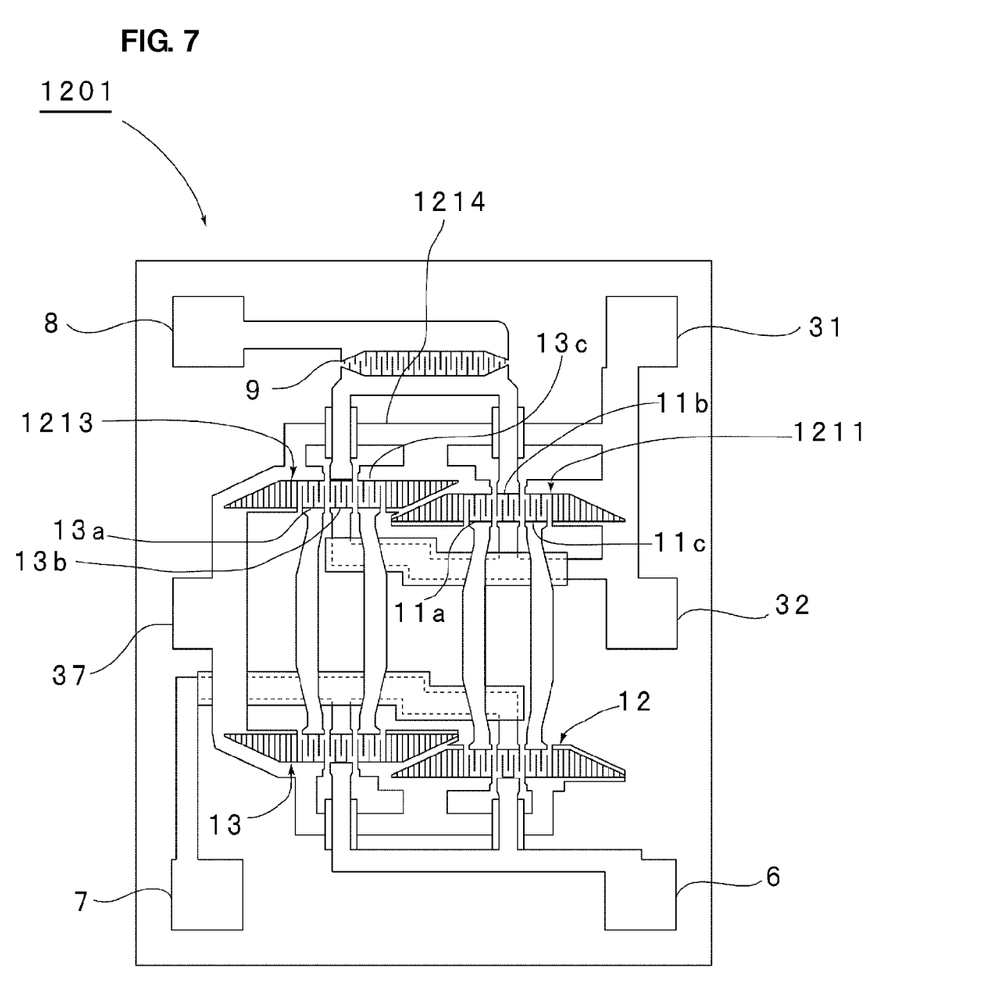
FIG. 7 is a schematic plan view illustrating the electrode structure of the elastic wave device of the comparative example.

Structures of a reception-side filter of a comparative example prepared for comparison are individually schematically illustrated in plan view in FIG. 7. An elastic wave device 1201 of a comparative example is configured similarly to the reception-side filter 4, except that the structure that connects ends of the first IDT electrodes 11a and 13a of a first elastic wave filter 1211 and a third elastic wave filter 1213, which are on sides to be connected to the ground potential, and ground terminals, are different. More specifically, as illustrated in FIG. 7, the end of the first IDT electrode 11a on the side connected to the ground potential and the end of the first IDT electrode 13a on the side connected to the ground potential are connected to each other through wiring 1214 and are each connected to the first to third ground terminals 31, 32 and 37. The remaining structures are substantially the same.

Therefore, in the comparative example, the number of ground terminals to which ends of the first to third IDT electrodes 11a to 11c of the first elastic wave filter 1211 on the sides connected to the ground potential, are connected, is three, particularly, the first to third ground terminals 31, 32, and 37. Similarly, the number of ground terminals connected to ends of the first to third IDT electrodes 13a to 13c of the third elastic wave filter 1213 on the sides connected to the ground potential, is also three. Therefore, the current paths through which the first and third elastic wave filters 1211 and 1213 are connected to the ground potential are substantially the same.

As shown in FIG. 3, it is clear that the insertion loss within the pass band according to the present preferred embodiment is substantially the same as that for the elastic wave device 1201 of the comparative example.

Figure 4:
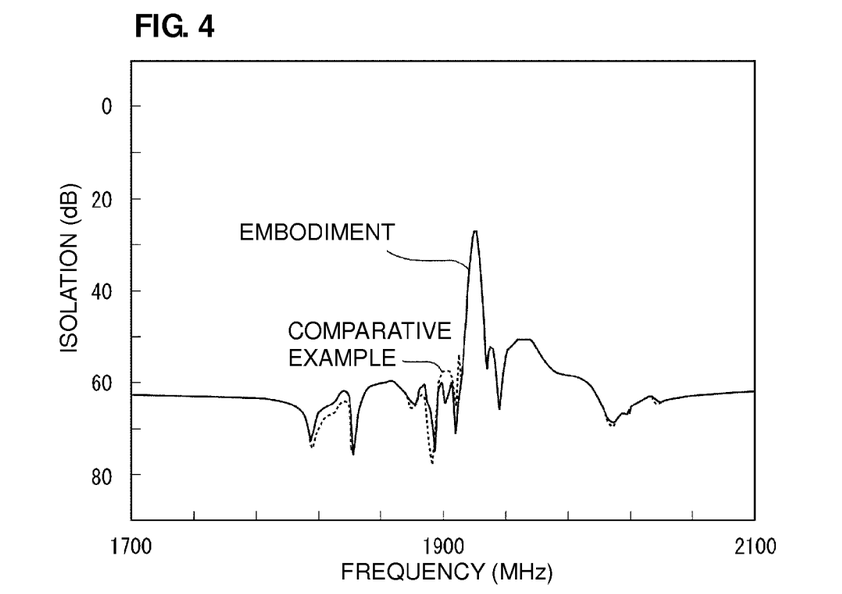
FIG. 4 is a graph illustrating isolation characteristics of the elastic wave device according to the first preferred embodiment and of the elastic wave device of the comparative example.

Furthermore, the transmission-reception isolation characteristics for duplexers into which elastic wave devices of the present preferred embodiment and the comparative example have been incorporated are illustrated in FIG. 4.

As is clear from FIG. 4, by using the elastic wave device according to the present preferred embodiment, isolation of the transmission-side pass band is improved by approximately 3 dB as compared to the comparative example. Also, as illustrated in FIG. 4, the communication characteristics of the reception-side filter are negligibly degraded.

Therefore, according to the present preferred embodiment, it is clear that, in the reception-side filter 4, degradation of communication characteristics in the reception-side pass band are negligibly degraded and isolation of the transmission-side band significantly improved.

Figure 5:
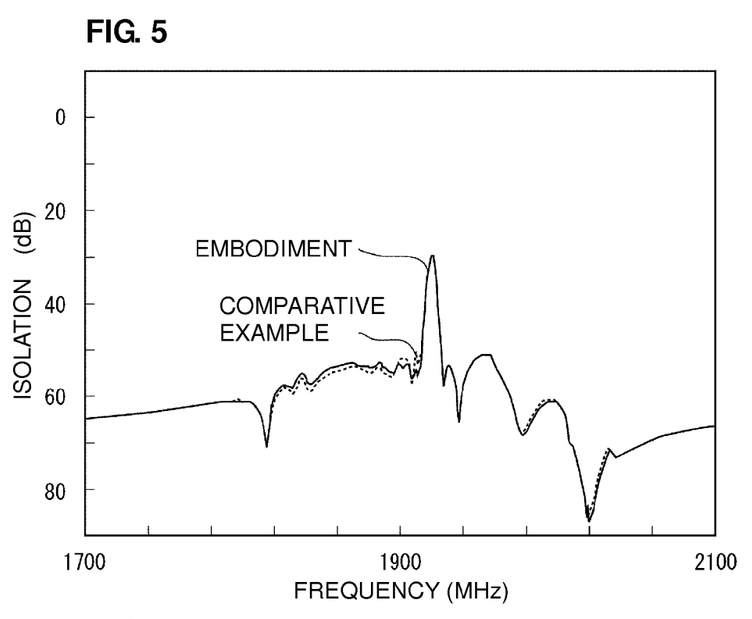
FIG. 5 is a graph illustrating isolation characteristics for a first balanced terminal in duplexers including the elastic wave devices of the first preferred embodiment and the comparative example.
Figure 6:
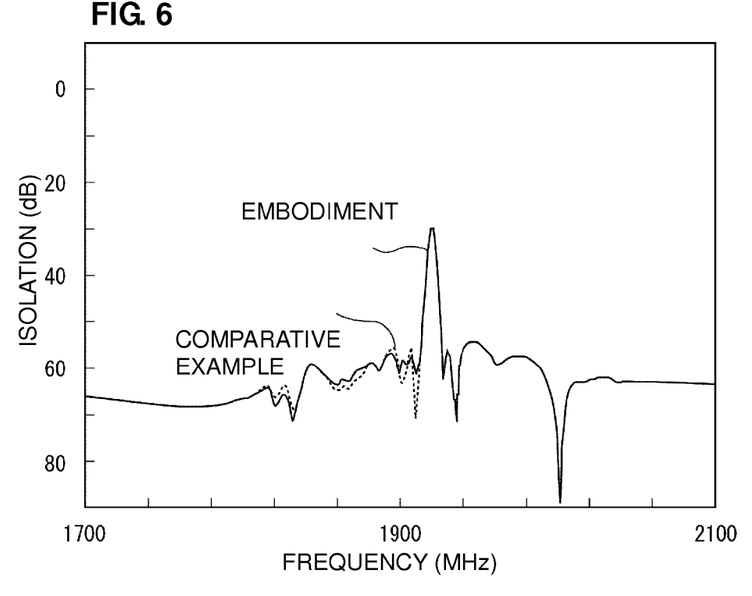
FIG. 6 is a graph illustrating isolation characteristics for a second balanced terminal in duplexers including the elastic wave devices of the first preferred embodiment and the comparative example.

FIG. 5 and FIG. 6 illustrate isolation characteristics for the first balanced terminal and the second balanced terminal in the present preferred embodiment and the comparative example, respectively. It is clear that, in the present preferred embodiment, a spurious response is small in the vicinity of the reception-side pass band for both the first and second balanced terminals as compared to the comparative example. That is, it is clear that this does not mean that isolation is improved due to the characteristic of balance between the first balanced terminal and the second balanced terminal being high but rather that isolation is improved due to the magnitude of the spurious response itself being small.

In the present preferred embodiment, as described above, the improvement of isolation as a result of the current paths connecting the IDT electrodes 11a and 13a to the ground potential in the first elastic wave filter 11 and the third elastic wave filter 13 being different from one another, is thought to be due to the following reason. That is, since the ground connection paths of the IDT electrode 11a and the IDT electrode 13a are not symmetrical with each other, the currents flowing through the current paths connected to the ground potential for the first and third elastic wave filters 11 and 13, which are connected in parallel with each other, are not symmetrical with each other. As a result, it is thought that an effect is obtained that is approximately the same as making the design parameters of the IDT electrode 11a and the IDT electrode 13a not symmetrical to each other. Consequently, a spurious response in the transmission-side pass band becomes small.

As described above, this effect of a reduced spurious response can also be obtained by making the design parameters, specifically the number of pairs of electrode fingers and the wavelength, of the IDT electrodes 11a to 11c and 13a to 13c, not symmetrical to each other. However, in this case, there is a problem in that, for example, a ripple may be generated in the pass band.

In contrast, in the case in which the current paths connected to the ground potential are not symmetrical to each other as in the present preferred embodiment, rather than making design parameters of the first and third elastic wave filters 11 and 13, which are connected in parallel with each other, not symmetrical, ripples are not significantly generated in the pass band and a spurious response is small.

Figure 8:
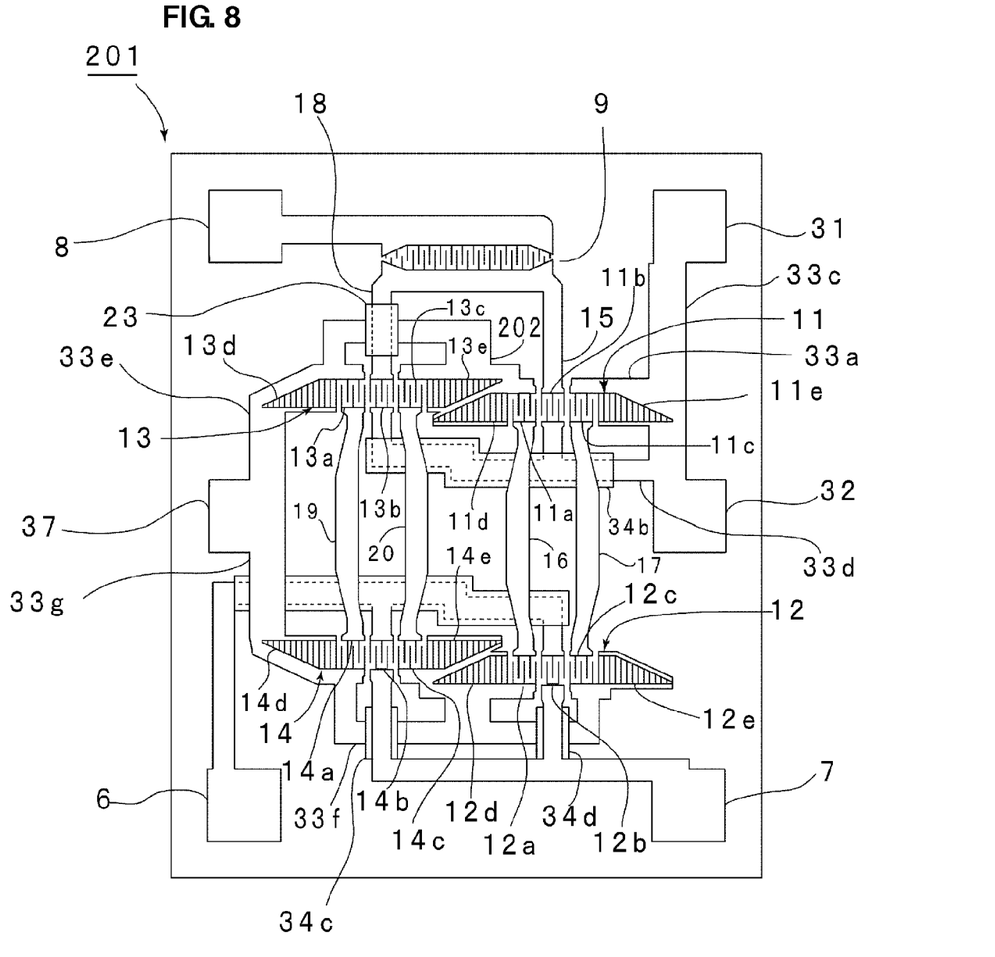
FIG. 8 is a schematic plan view illustrating a modified example of the elastic wave device according to the first preferred embodiment of the present invention.

FIG. 8 is a schematic plan view illustrating a modified example of the elastic wave device according to a preferred embodiment of the present invention and corresponds to FIG. 1 of the present preferred embodiment.

In an elastic wave device 201 of the modified example illustrated in FIG. 8, the wiring 15 preferably does not cross any other wirings and an end of the first IDT electrode 11a on the side connected to the ground potential and an end of the first IDT electrode 13a on the side connected to the ground potential are connected to each other through wiring 202. Therefore, the ends of the first IDT electrodes 11a and 13a of the first elastic wave filter 11 and the third elastic wave filter 13 on the sides connected to the ground potential are preferably all connected to the third ground terminal 37. Here, an insulating film 23 to enable overcrossing is provided at the intersection of the wiring 18 and the wiring 202. Therefore, the insulating film 34a illustrated in FIG. 1 is not provided.

On the other hand, the third IDT electrode 11c is connected to the first and second ground terminals 31 and 32 and the third IDT electrode 13c is only connected to the third ground terminal 37. Accordingly, since, in the first and third elastic wave filters 11 and 13, which are connected in parallel with each other, the current paths through which the corresponding third IDT electrode 11c and third IDT electrode 13c are connected to the ground potential are preferably not symmetrical, similarly to in the present preferred embodiment, the spurious level in the transmission-side pass band is reduced and, consequently, the isolation characteristics are effectively improved.

As is clear from the present preferred embodiment and the modified example of a preferred embodiment of the present invention, by making current paths connected to the ground potential that are between the connected-in-parallel elastic wave filters not symmetrical with each other, the same effect can be obtained in both the present preferred embodiment and the modified example of a preferred embodiment and, therefore, the specific shapes of the current paths provided to achieve this non-symmetry are not particularly limited.

Figure 9:
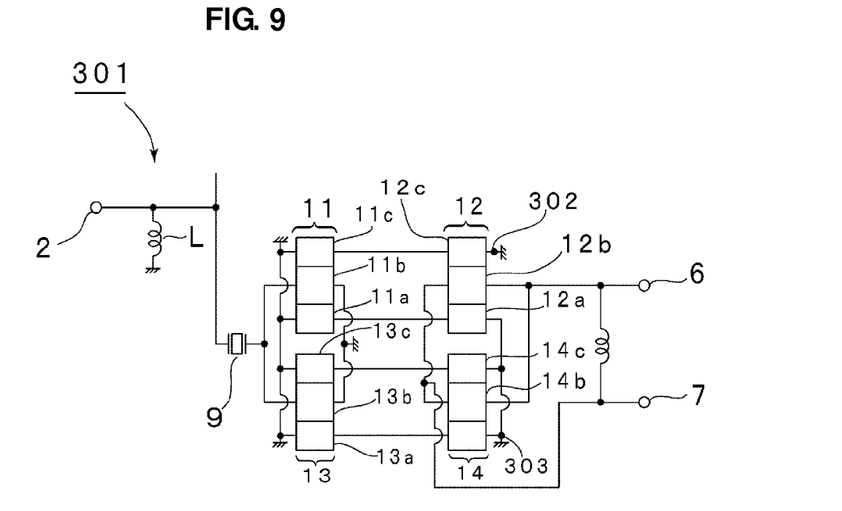
FIG. 9 is a schematic circuit diagram of an elastic wave device according to a second preferred embodiment of the present invention.

FIG. 9 is a schematic circuit diagram of an elastic wave filter device according to a second preferred embodiment of the present invention. In the elastic wave filter device 301 of the second preferred embodiment, the first and second elastic wave filters 11 and 12 and the third and fourth elastic wave filters 13 and 14 are preferably connected between the unbalanced terminal 8 and the first and second balanced terminals 6 and 7 similarly to the first preferred embodiment. The difference is that, in the elastic wave filter device of the first preferred embodiment, the current paths through which ends of the IDT electrodes 11a and 13a in the first elastic wave filter 11 and the third elastic wave filter 13 on the sides to be connected to the ground potential are connected to the ground potential, are not symmetrical, whereas in this preferred embodiment the current paths on the sides at which the IDTs are connected to the ground potential between the second and fourth elastic wave filters 12 and 14 are different.

More specifically, the end of the third IDT electrode 12c of the second elastic wave filter 12 on the side connected to the ground potential is preferably connected to a schematically illustrated first ground terminal 302. On the other hand, the end of the first IDT electrode 12a on the side connected to the ground potential is preferably connected to the ends of the first and third IDT electrodes 14a and 14c of the fourth elastic wave filter 14 on the sides connected to the ground potential and is connected to a second ground terminal 303. Therefore, the numbers of ground terminals connected to the second elastic wave filter 12 and the fourth elastic wave filter 14 are different. In other words, the current paths through which the second elastic wave filter 12 and the fourth elastic wave filter 14 are connected to the ground potential are different and, therefore, similarly to the first preferred embodiment, the spurious level in the transmission-side pass band is small and the isolation characteristics is effectively improved.

Figure 10:
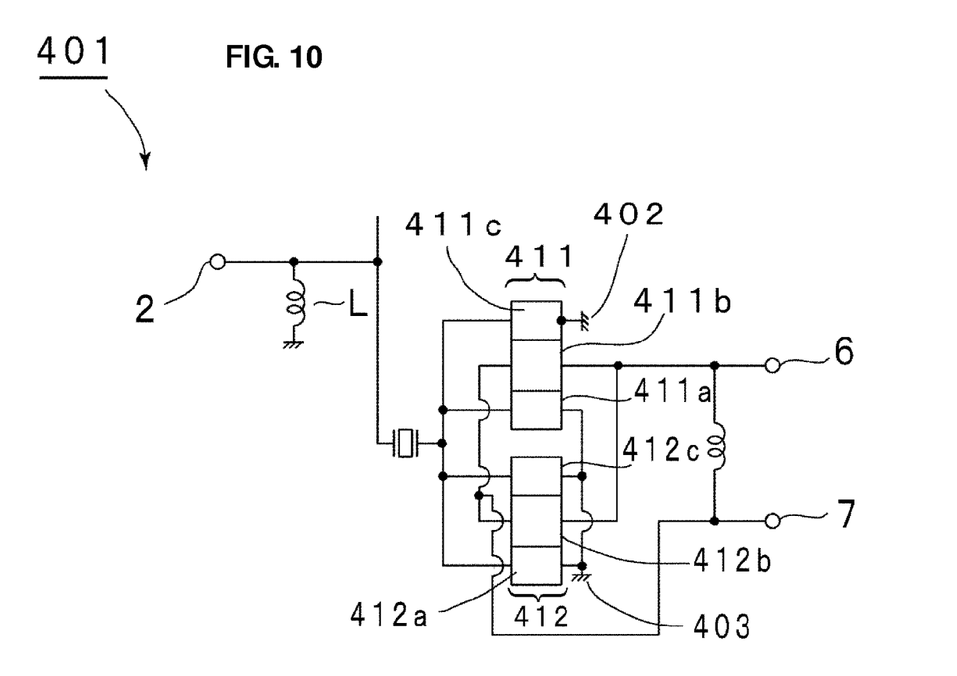
FIG. 10 is a schematic circuit diagram of an elastic wave device according to a third preferred embodiment of the present invention.

FIG. 10 is a schematic circuit diagram illustrating the circuit configuration of an elastic wave device according to a third preferred embodiment of the present invention.

In an elastic wave device 401 illustrated in FIG. 10, first and second elastic wave filters 411 and 412 are preferably connected in parallel between the unbalanced terminal 8 and the first and second balanced terminals 6 and 7. That is, no structure is provided in which two longitudinally-coupled-resonator-type elastic wave filter elements are cascade connected as in the elastic wave device of the first preferred embodiment. The first and second elastic wave filters 411 and 412 are both preferably float-balance-type elastic wave filters.

In other words, a circuit configuration is provided in which the first and third elastic wave filters 11 and 13 of the elastic wave filter device 301 of the second preferred embodiment have been omitted. Therefore, the first and second elastic wave filters 411 and 412 are preferably arranged so as to correspond to the second and fourth elastic wave filters 12 and 14 of the second preferred embodiment.

Thus, the end of a third IDT electrode 411c of the first elastic wave filter 411 on the side connected to the ground potential is connected to a first ground terminal 402 and the ends of an IDT electrode 411a and first and third IDT electrodes 412a and 412c of the second elastic wave filter 412 on the sides connected to the ground potential are connected to each other and connected to a second ground terminal 403. Thus, the current paths on sides connected to the ground potential between the first and second elastic wave filters 411 and 412 each connected to the first balanced terminal 6 and the second balanced terminal 7 are different and, therefore, similarly to the second preferred embodiment, the spurious level in the pass band is small. Thus, isolation characteristics for the transmission side pass band are effectively improved.

Figure 11:
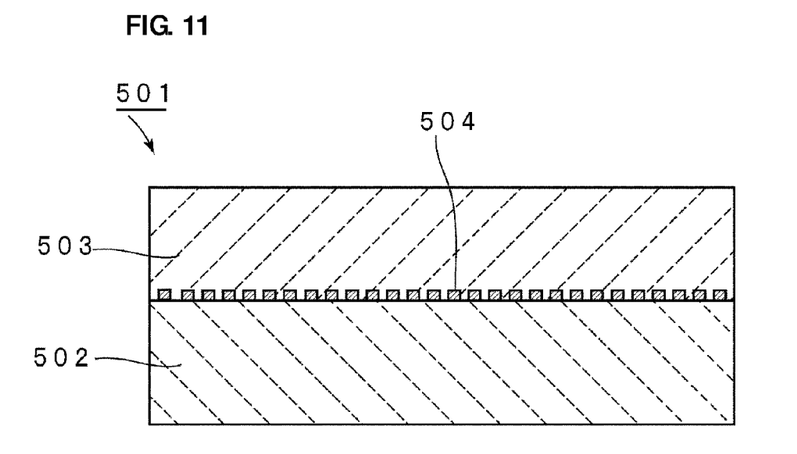
FIG. 11 is a schematic front sectional view of a boundary acoustic wave device to which a preferred embodiment of the present invention has been applied.

Furthermore, in the first to third preferred embodiments, surface acoustic wave devices that utilize surface acoustic waves have been described. However, elastic wave devices according to preferred embodiments of the present invention may instead be boundary acoustic wave devices that utilize boundary acoustic waves. For example, in a boundary acoustic wave device 501 illustrated in the schematic front sectional view of FIG. 11, a dielectric body 503 is stacked on a piezoelectric substrate 502 made of a piezoelectric material. An electrode structure 504 including an IDT is provided at the boundary plane between the piezoelectric substrate 502 and the dielectric body 503. The electrode structure 504 of the boundary acoustic wave filter devices according to preferred embodiments of the present invention may preferably be the electrode structure of any of the above-described preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   an unbalanced terminal provided on the piezoelectric substrate;
   first and second balanced terminals provided on the piezoelectric substrate;
   a plurality of ground terminals provided on the piezoelectric substrate;
   a longitudinally-coupled-resonator-type first elastic wave filter provided on the piezoelectric substrate; and
   a longitudinally-coupled-resonator-type second elastic wave filter provided on the piezoelectric substrate; wherein
   the first elastic wave filter includes first to third IDT electrodes arranged in order in an elastic wave propagation direction and two reflectors arranged on both sides in the elastic wave propagation direction of a region in which the first to third IDT electrodes are provided, one end of the second IDT electrode being connected to the first balanced terminal and the other end thereof being connected to the second balanced terminal;
   in the first elastic wave filter, one end of the first IDT electrode and one end of the third IDT electrode are connected to the unbalanced terminal and the other end of the first IDT electrode and the other end of the third IDT electrode are connected to at least one of the plurality of ground terminals;
   the second elastic wave filter includes first to third IDT electrodes arranged in order in an elastic wave propagation direction and two reflectors arranged on both sides in the elastic wave propagation direction of a region in which the first to third IDT electrodes are provided;
   in the second elastic wave filter, one end of the second IDT electrode is connected to the first balanced terminal and the other end thereof is connected to the second balanced terminal, one end of the first IDT electrode and one end of the third IDT electrode are connected to the unbalanced terminal, and the other end of the first IDT electrode and the other end of the third IDT electrode are connected to at least one of the plurality of ground terminals;
   a current path connecting the first elastic wave filter and the at least one of the plurality of ground terminals and a current path connecting the second elastic wave filter and the at least one of the plurality of ground terminals are different; and
   a number of the at least one of the plurality of ground terminals connected to the first elastic wave filter and a number of the at least one of the plurality of ground terminals connected to the second elastic wave filter are different from one another.

2. The elastic wave device according to claim 1, wherein the elastic wave is a surface acoustic wave and the elastic wave filters are surface acoustic wave filters.

3. The elastic wave device according to claim 1, wherein the elastic wave is a boundary acoustic wave and the elastic wave filters are boundary acoustic wave filters.

4. A duplexer comprising a reception-side filter and a transmission-side filter, wherein the reception-side filter includes the elastic wave device according to claim 1.

5. The duplexer according to claim 4, further comprising:
   an antenna-side terminal and an elastic wave resonator; wherein
   the elastic wave resonator is connected in series between the antenna-side terminal and the unbalanced terminal of the elastic wave device.

6. An elastic wave device comprising:
   a piezoelectric substrate;
   an unbalanced terminal provided on the piezoelectric substrate;
   first and second balanced terminals provided on the piezoelectric substrate;
   a plurality of ground terminals provided on the piezoelectric substrate;
   a longitudinally-coupled-resonator-type first elastic wave filter provided on the piezoelectric substrate; and
   a longitudinally-coupled-resonator-type second elastic wave filter provided on the piezoelectric substrate; wherein
   the first elastic wave filter includes first to third IDT electrodes arranged in order in an elastic wave propagation direction and two reflectors arranged on both sides in the elastic wave propagation direction of a region in which the first to third IDT electrodes are provided, one end of the second IDT electrode being connected to the first balanced terminal and the other end thereof being connected to the second balanced terminal;
   in the first elastic wave filter, one end of the first IDT electrode and one end of the third IDT electrode are connected to the unbalanced terminal and the other end of the first IDT electrode and the other end of the third IDT electrode are connected to at least one of the plurality of ground terminals;
   the second elastic wave filter includes first to third IDT electrodes arranged in order in an elastic wave propagation direction and two reflectors arranged on both sides in the elastic wave propagation direction of a region in which the first to third IDT electrodes are provided;
   in the second elastic wave filter, one end of the second IDT electrode is connected to the first balanced terminal and the other end thereof is connected to the second balanced terminal, one end of the first IDT electrode and one end of the third IDT electrode are connected to the unbalanced terminal, and the other end of the first IDT electrode and the other end of the third IDT electrode are connected to at least one of the plurality of ground terminals;

a current path connecting the first elastic wave filter and the at least one of the plurality of ground terminals and a current path connecting the second elastic wave filter and the at least one of the plurality of ground terminals are different;

in the first elastic wave filter, the other end of the first IDT electrode and the other end of the third IDT electrode are connected to different ones of the plurality of ground terminals; and in the second elastic wave filter, the other end of the first IDT electrode and the other end of the third IDT electrode are connected to the same one of the plurality of ground terminals.

7. The elastic wave device according to claim 6, wherein the elastic wave is a surface acoustic wave and the elastic wave filters are surface acoustic wave filters.

8. The elastic wave device according to claim 6, wherein the elastic wave is a boundary acoustic wave and the elastic wave filters are boundary acoustic wave filters.

9. A duplexer comprising a reception-side filter and a transmission-side filter, wherein the reception-side filter includes the elastic wave device according to claim 6.

10. The duplexer according to claim 9, further comprising:
an antenna-side terminal and an elastic wave resonator; wherein
the elastic wave resonator is connected in series between the antenna-side terminal and the unbalanced terminal of the elastic wave device.

11. An elastic wave device comprising:
a piezoelectric substrate;
an unbalanced terminal provided on the piezoelectric substrate;
first and second balanced terminals provided on the piezoelectric substrate;
a plurality of ground terminals provided on the piezoelectric substrate;
longitudinally-coupled-resonator-type first to fourth elastic wave filters provided on the piezoelectric substrate;
first and second connection wirings that cascade connect the first elastic wave filter and the second elastic wave filter; and
third and fourth connection wirings that cascade connect the third and fourth elastic wave filters; wherein
each of the first to fourth elastic wave filters includes first to third IDT electrodes arranged in order in an elastic wave propagation direction and reflectors arranged on both sides in the elastic wave propagation direction of a region in which the first to third IDT electrodes are provided;
in the first elastic wave filter, one end of the second IDT electrode is connected to the unbalanced terminal and the other end thereof is connected to at least one of the plurality of ground terminals, one end of the first IDT electrode is connected to the first connection wiring and the other end thereof is connected to at least one of the plurality of ground terminals, and one end of the third IDT electrode is connected to the second connection wiring and the other end thereof is connected to at least one of the plurality of ground terminals;
in the second elastic wave filter, one end of the second IDT electrode is connected to the first balanced terminal and the other end thereof is connected to the second balanced terminal, one end of the first IDT electrode is connected to the first connection wiring and the other end thereof is connected to at least one of the plurality of ground terminals, and one end of the third IDT electrode is connected to the second connection wiring and the other end thereof is connected to at least one of the plurality of ground terminals;

in the third elastic wave filter, one end of the second IDT electrode is connected to the unbalanced terminal and the other end thereof is connected to at least one of the plurality of ground terminals, one end of the first IDT electrode is connected to the third connection wiring and the other end thereof is connected to at least one of the plurality of ground terminals, and one end of the third IDT electrode is connected to the fourth connection wiring and the other end thereof is connected to at least one of the plurality of ground terminals;

in the fourth elastic wave filter, one end of the second IDT electrode is connected to the first balanced terminal and the other end thereof is connected to the second balanced terminal, one end of the first IDT electrode is connected to the third connection wiring and the other end thereof is connected to at least one of the plurality of ground terminals, and one end of the third IDT electrode is connected to the fourth connection wiring and the other end thereof is connected to at least one of the plurality of ground terminals;

a current path that connects the first and second elastic wave filters and the at least ones of the plurality of ground terminals and a current path that connects the third and fourth elastic wave filters and the at least ones of the plurality of ground terminals are different; and a total number of the at least one of the plurality of ground terminals connected to the first and second elastic wave filters and a total number of the at least one of the plurality of ground terminals connected to the third and fourth elastic wave filters are different from one another.

12. An elastic wave device comprising:
a piezoelectric substrate;
an unbalanced terminal provided on the piezoelectric substrate;
first and second balanced terminals provided on the piezoelectric substrate;
a plurality of ground terminals provided on the piezoelectric substrate;
longitudinally-coupled-resonator-type first to fourth elastic wave filters provided on the piezoelectric substrate;
first and second connection wirings that cascade connect the first elastic wave filter and the second elastic wave filter; and
third and fourth connection wirings that cascade connect the third and fourth elastic wave filters; wherein
each of the first to fourth elastic wave filters includes first to third IDT electrodes arranged in order in an elastic wave propagation direction and reflectors arranged on both sides in the elastic wave propagation direction of a region in which the first to third IDT electrodes are provided;
in the first elastic wave filter, one end of the second IDT electrode is connected to the unbalanced terminal and the other end thereof is connected to at least one of the plurality of ground terminals, one end of the first IDT electrode is connected to the first connection wiring and the other end thereof is connected to at least one of the plurality of ground terminals, and one end of the third IDT electrode is connected to the second connection wiring and the other end thereof is connected to at least one of the plurality of ground terminals;
in the second elastic wave filter, one end of the second IDT electrode is connected to the first balanced terminal and the other end thereof is connected to the second balanced terminal, one end of the first IDT electrode is connected to the first connection wiring and the other end thereof is connected to at least one of the plurality of ground terminals, and one end of the third IDT electrode is connected to the second connection wiring and the other end thereof is connected to at least one of the plurality of ground terminals;

in the third elastic wave filter, one end of the second IDT electrode is connected to the unbalanced terminal and the other end thereof is connected to at least one of the plurality of ground terminals, one end of the first IDT electrode is connected to the third connection wiring and the other end thereof is connected to at least one of the plurality of ground terminals, and one end of the third IDT electrode is connected to the fourth connection wiring and the other end thereof is connected to at least one of the plurality of ground terminals;

in the fourth elastic wave filter, one end of the second IDT electrode is connected to the first balanced terminal and the other end thereof is connected to the second balanced terminal, one end of the first IDT electrode is connected to the third connection wiring and the other end thereof is connected to at least one of the plurality of ground terminals, and one end of the third IDT electrode is connected to the fourth connection wiring and the other end thereof is connected to at least one of the plurality of ground terminals;

a current path that connects the first and second elastic wave filters and the at least ones of the plurality of ground terminals and a current path that connects the third and fourth elastic wave filters and the at least ones of the plurality of ground terminals are different;

in the first elastic wave filter, the other end of the first IDT electrode and the other end of the third IDT electrode are connected to different ones of the plurality of ground terminals; and in the third elastic wave filter, the other end of the first IDT electrode and the other end of the third IDT electrode are connected to the same one of the plurality of ground terminals.

13. An elastic wave device comprising:

a piezoelectric substrate;

an unbalanced terminal provided on the piezoelectric substrate;

first and second balanced terminals provided on the piezoelectric substrate;

a plurality of ground terminals provided on the piezoelectric substrate;

longitudinally-coupled-resonator-type first to fourth elastic wave filters provided on the piezoelectric substrate;

first and second connection wirings that cascade connect the first elastic wave filter and the second elastic wave filter; and third and fourth connection wirings that cascade connect the third and fourth elastic wave filters; wherein each of the first to fourth elastic wave filters includes first to third IDT electrodes arranged in order in an elastic wave propagation direction and reflectors arranged on both sides in the elastic wave propagation direction of a region in which the first to third IDT electrodes are provided;

in the first elastic wave filter, one end of the second IDT electrode is connected to the unbalanced terminal and the other end thereof is connected to at least one of the plurality of ground terminals, one end of the first IDT electrode is connected to the first connection wiring and the other end thereof is connected to at least one of the plurality of ground terminals, and one end of the third IDT electrode is connected to the second connection wiring and the other end thereof is connected to at least one of the plurality of ground terminals;

in the second elastic wave filter, one end of the second IDT electrode is connected to the first balanced terminal and the other end thereof is connected to the second balanced terminal, one end of the first IDT electrode is connected to the first connection wiring and the other end thereof is connected to at least one of the plurality of ground terminals, and one end of the third IDT electrode is connected to the second connection wiring and the other end thereof is connected to at least one of the plurality of ground terminals;

in the third elastic wave filter, one end of the second IDT electrode is connected to the unbalanced terminal and the other end thereof is connected to at least one of the plurality of ground terminals, one end of the first IDT electrode is connected to the third connection wiring and the other end thereof is connected to at least one of the plurality of ground terminals, and one end of the third IDT electrode is connected to the fourth connection wiring and the other end thereof is connected to at least one of the plurality of ground terminals;

in the fourth elastic wave filter, one end of the second IDT electrode is connected to the first balanced terminal and the other end thereof is connected to the second balanced terminal, one end of the first IDT electrode is connected to the third connection wiring and the other end thereof is connected to at least one of the plurality of ground terminals, and one end of the third IDT electrode is connected to the fourth connection wiring and the other end thereof is connected to at least one of the plurality of ground terminals;

a current path that connects the first and second elastic wave filters and the at least ones of the plurality of ground terminals and a current path that connects the third and fourth elastic wave filters and the at least ones of the plurality of ground terminals are different;

in the second elastic wave filter, the other end of the first IDT electrode and the other end of the third IDT electrode are connected to different ones of the plurality of ground terminals; and in the fourth elastic wave filter, the other end of the first IDT electrode and the other end of the third IDT electrode are connected to the same one of the plurality of ground terminals.

* * * * *